United States Patent [19]

Rust

[11] Patent Number: 5,680,601
[45] Date of Patent: Oct. 21, 1997

[54] COMPRESSION SYSTEM FOR REDUCING THE OCCURRENCE OF A LITERAL PREFIX

[75] Inventor: Robert A. Rust, Boise, Id.

[73] Assignee: Hewlett-Packard Company, Palo Alto, Calif.

[21] Appl. No.: 355,751

[22] Filed: Dec. 14, 1994

[51] Int. Cl.$^6$ .................................................. G06F 17/30
[52] U.S. Cl. ................ 395/601; 395/611; 341/50; 341/51; 341/79
[58] Field of Search .............................. 395/600, 800, 395/615, 601, 611; 341/50, 55, 51, 79; 382/21; 364/300

[56] References Cited

U.S. PATENT DOCUMENTS

| | | | |
|---|---|---|---|
| 4,453,217 | 6/1984 | Boivie | 364/300 |
| 4,525,860 | 7/1985 | Boivie | 382/21 |
| 5,155,484 | 10/1992 | Chambers | 341/55 |
| 5,329,405 | 7/1994 | Hou et al. | 395/800 |
| 5,455,576 | 10/1995 | Clark, II et al. | 341/50 |

*Primary Examiner*—Thomas G. Black
*Assistant Examiner*—C. Lewis
*Attorney, Agent, or Firm*—Anthony J. Baca

[57] ABSTRACT

A method for reducing the amount of memory used to store an original data in a processing system by reducing the occurrence of a literal prefix. The method is completed by comparing strings from the original data to valid elements in a dictionary. If a match is found, then a data code, which points to the valid dictionary element, is stored as compressed data in the memory. If a match is not found, then the entry is defined as a literal. Assuming the literal is defined, next determine if a dictionary element pointed to by the literal is valid and if so, then store a literal prefix into the compressed data in the memory. Finally, independent of whether the lateral points to a valid dictionary element, the literal itself is stored into the compressed data in the memory. To decompress the compressed data first an entry of the compressed data is retrieved from the memory. If the entry is a literal prefix, then output a next entry of the compressed data. In the alternative, if the entry points to an invalid dictionary element then output the entry because it is a literal. Finally, the only alternative remaining is that the entry points to a valid dictionary element. Thus the a code that must be decompressed before it can be output.

13 Claims, 14 Drawing Sheets

FIG. 1

| COMPRESSED DATA | LITERAL PREFIX | LITERAL | COMPRESSED DATA | COMPRESSED DATA | LITERAL PREFIX | LITERAL | EOD |
|---|---|---|---|---|---|---|---|
| 0x12 | 0x00 | 0x34 | 0x14 | 0x12 | 0x00 | 0x12 | 0x01 |

FIG. 7

| COMPRESSED DATA | LITERAL | COMPRESSED DATA | COMPRESSED DATA | LITERAL PREFIX | LITERAL | EOD |
|---|---|---|---|---|---|---|
| 0x12 | 0x34 | 0x14 | 0x12 | 0x00 | 0x12 | 0x01 |

| MEMORY LOCATION | DATA |
|---|---|
| 0x12 | STRING IN LOC 12 |
| 0x13 | STRING IN LOC 13 |
| 0x14 | STRING IN LOC 14 |
| 0x15 | XX |
| 0x16 | XX |

FIG. 2

| SEQUENCE | NO UPDATES | ONE UPDATE | TWO UPDATES |
|---|---|---|---|
| COMPRESSED DATA FOLLOWED BY A LITERAL | | | X |
| LITERAL FOLLOWED BY A LITERAL | | X | |
| COMPRESSED DATA FOLLOWED COMPRESSED DATA | | X | |
| LITERAL FOLLOWED BY COMPRESSED DATA | X | | |

FIG. 3

| MEMORY LOCATION | DATA |
|---|---|
| 0x12 | STRING IN LOC 12 |
| 0x13 | STRING IN LOC 13 |
| 0x14 | STRING IN LOC 14 |
| 0x15 | 12/34 |
| 0x16 | 00/34 |

FIG. 4

| MEMORY LOCATION | DATA |
|---|---|
| 0x12 | STRING IN LOC 12 |
| 0x13 | STRING IN LOC 13 |
| 0x14 | STRING IN LOC 14 |
| 0x15 | 12/34 |
| 0x16 | 00/34 |
| 0x17 | 14/75 |

FIG. 5

| MEMORY LOCATION | DATA |
|---|---|
| 0x12 | STRING IN LOC 12 |
| 0x13 | STRING IN LOC 13 |
| 0x14 | STRING IN LOC 14 |
| 0x15 | 12/34 |
| 0x16 | 00/34 |
| 0x17 | 14/75 |
| 0x18 | 12/12 |
| 0x19 | 00/12 |

FIG. 6

| K | w | _ | K | w | _ | K | w | K | w | K | A |
|---|---|---|---|---|---|---|---|---|---|---|---|

FIG. 8

Output: | 00 | K |

Input: K

| LOCATION | LINK | DATA |
|---|---|---|
| --> 0x02 | 00 | K |
| 0x03 | | |

FIG. 9A

Output: | 00 | K | w |

Input: w

| LOCATION | LINK | DATA |
|---|---|---|
| 0x02 | 00 | K |
| --> 0x03 | 00 | w |
| 0x04 | | |

FIG. 9B

Output: | 00 | K | w | _ |

Input: _

| LOCATION | LINK | DATA |
|---|---|---|
| 0x02 | 00 | K |
| 0x03 | 00 | w |
| --> 0x04 | 00 | _ |
| 0x05 | | |

FIG. 9C

Output: | 00 | K | w | _ | 02 |

Input: Kw

| LOCATION | LINK | DATA |
|---|---|---|
| 0x02 | 00 | K |
| 0x03 | 00 | w |
| 0x04 | 00 | _ |
| --> 0x05 | 02 | w |
| 0x06 | | |

FIG. 9D

Output: | 00 | K | w | _ | 02 | 03 | 04 |

Input: _

| LOCATION | LINK | DATA |
|---|---|---|
| 0x02 | 00 | K |
| 0x03 | 00 | w |
| 0x04 | 00 | _ |
| 0x05 | 02 | w |
| --> 0x06 | 03 | _ |
| 0x07 | | |

FIG. 9E

Output: | 00 | K | w | _ | 02 | 03 | 04 | 05 |

Input: KwK

| LOCATION | LINK | DATA |
|---|---|---|
| 0x02 | 00 | K |
| 0x03 | 00 | w |
| 0x04 | 00 | _ |
| 0x05 | 02 | w |
| 0x06 | 03 | _ |
| 0x07 | 04 | K |
| --> 0x08 | 05 | K |
| 0x09 | | |

FIG. 9F

Output: | 00 | K | w | _ | 02 | 03 | 04 | 05 | 08 | A | 01 |

Input: wKA

| LOCATION | LINK | DATA |
|---|---|---|
| 0x02 | 00 | K |
| 0x03 | 00 | w |
| 0x04 | 00 | _ |
| 0x05 | 02 | w |
| 0x06 | 03 | _ |
| 0x07 | 04 | K̄ |
| 0x08 | 05 | K |
| 0x09 | 08 | A |
| --> 0x0A | 00 | A |

FIG. 9G

| 00 | K | w | _ | 02 | 03 | 04 | 05 | 08 | A | 01 |

FIG. 10

Output: | K |

Input: 00 K

| LOCATION | LINK | DATA |
|---|---|---|
| --> 0x02 | 00 | K |
| 0x03 | | |

FIG. 11A

Output: | K | w |

Input: w

| LOCATION | LINK | DATA |
|---|---|---|
| 0x02 | 00 | K |
| --> 0x03 | 00 | w |
| 0x04 | | |

FIG. 11B

Output: | K | w | _ |

Input: _

| LOCATION | LINK | DATA |
|---|---|---|
| 0x02 | 00 | K |
| 0x03 | 00 | w |
| --> 0x04 | 00 | _ |
| 0x05 | | |

FIG. 11C

Output: | K | w | _ | K |

Input: 02

| LOCATION | LINK | DATA |
|---|---|---|
| 0x02 | 00 | K |
| 0x03 | 00 | w |
| --> 0x04 | 00 | _ |
| 0x05 | | |

FIG. 11D

Output: | K | w | _ | K | w |

Input: 03

| LOCATION | LINK | DATA |
|---|---|---|
| 0x02 | 00 | K |
| 0x03 | 00 | w |
| 0x04 | 00 | _ |
| --> 0x05 | 02 | w |
| 0x06 | | |

FIG. 11E

Output: | K | w | _ | K | w | _ |

Input: 04

| LOCATION | LINK | DATA |
|---|---|---|
| 0x02 | 00 | K |
| 0x03 | 00 | w |
| 0x04 | 00 | _ |
| 0x05 | 02 | w |
| --> 0x06 | 03 | _ |
| 0x07 | | |

FIG. 11F

Output: | K | w | _ | K | w | _ | K | w |

Input: 05

| LOCATION | LINK | DATA |
|---|---|---|
| 0x02 | 00 | K |
| 0x03 | 00 | w |
| 0x04 | 00 | _ |
| 0x05 | 02 | w |
| 0x06 | 03 | _ |
| --> 0x07 | 04 | K̄ |
| 0x08 | | |

FIG. 11G

Output: | K | w | _ | K | w | _ | K | w | K | w | K |

Input: 08

| LOCATION | LINK | DATA |
|---|---|---|
| 0x02 | 00 | K |
| 0x03 | 00 | w |
| 0x04 | 00 | _ |
| 0x05 | 02 | w |
| 0x06 | 03 | _ |
| 0x07 | 04 | K̄ |
| --> 0x08 | 05 | K |
| 0x09 | | |

FIG. 11H

Output: | K | w | _ | K | w | _ | K | w | K | w | K | A |

Input: A 01

| LOCATION | LINK | DATA |
|---|---|---|
| 0x02 | 00 | K |
| 0x03 | 00 | w |
| 0x04 | 00 | _ |
| 0x05 | 02 | w |
| 0x06 | 03 | _ |
| 0x07 | 04 | K |
| 0x08 | 05 | K |
| 0x09 | 08 | A |
| --> 0x0A | 00 | A |

FIG. 11I

COMPRESSION SYSTEM FOR REDUCING THE OCCURRENCE OF A LITERAL PREFIX

TECHNICAL FIELD

The present invention relates to data compression and more particularly, to an improvement in efficiency in the compression ratio by reducing the need for a literal prefix.

BACKGROUND OF THE INVENTION

Data compression systems are known in the prior art that encode a stream of digital data signals into compressed digital code signals and decode the compressed digital code signals back into the original data. Data compression refers to any process that attempts to convert data in a given format into an alternative format requiring less space than the original. The objective of data compression systems is to effect a savings in the amount of storage required to hold or the amount of time required to transmit a given body of digital information.

To be of practical utility, a data compression system should satisfy certain criteria. The system should have reciprocity. In order for a data compression system to possess the property of reciprocity it must be possible to re-expand or decode the compressed data back into its original form without any alteration or loss of information. The decoded and original data must be identical and indistinguishable with respect to each other. The property of reciprocity is synonymous to that of strict noiselessness used in information theory. Some applications do not require strict adherence to the property of reciprocity. One such application in particular is when dealing with graphical data. Because the human eye is not that sensitive to noise, some alteration or loss of information during the compression de-compression process is acceptable.

The system should provide sufficient performance with respect to the data rates provided by and accepted by the devices with which the data compression and de-compression systems are communicating. The rate at which data can be compressed is determined by the input data processing rate into the compression system, typically in millions of bytes per second (megabytes/sec). Sufficient performance is necessary to maintain the data rates achieved in present day disk, tape and communication systems which rates typically exceed one megabyte/sec. Thus, the data compression and decompression system must have enough data band-widths so as to not adversely affect the overall system. The performance of data compression and decompression systems is typically limited by the computations necessary to compress and de-compress and the speed of the system components such as, random access memory (RAM), and the like, utilized to store statistical data and guide the compression and de-compression process.

Another important criteria in the design of data compression and de-compression systems is compression effectiveness, which is characterized by the compression ratio. The compression ratio is the ratio of data size in uncompressed form divided by the size in compressed form. In order for data to be compressible, the data must contain redundancy. Compression effectiveness is determined by how effectively the compression procedure uses the redundancy in the input data. In typical computer stored data, redundancy occurs both in the nonuniform usage of individual symbology, example digits, bytes, or characters, and in frequent recurrence of symbol sequences, such as common words, blank record fields and the like.

General purpose data compression procedures are also known in the prior art, three relevant procedures being the Huffman method, the Tunstall method and the Lempel-Ziv method. The Huffman method is widely known and used, reference thereto in article of D. A. Huffman entitled "A Method For Construction Of Minimum Redundancy Codes", Proceedings IRE, 40, 10 pages 1098–1100 (Sept. 1952). Reference to the Tunstall algorithm may be found in Doctoral thesis of B. P. Tunstall entitled "Synthesis of Noiseless Compression Codes", Georgia Institute of Technology (Sept. 1967). Reference may be had to the Lempel-Ziv procedure in a paper authored by J. Ziv and A. Lempel entitled "A Universal Algorithm For Sequential Data Compression", IEEE Transactions on Information Theory, IT-23, 3, pages 337–343 (May, 1977).

The Lempel-Ziv procedure maps variable length segments of the symbols into variable length binary words. It is asymptotically optimal when there are no constraints on the input or output segments. In this procedure the input data string is parsed into adaptively grown segments, each segment consisting of an exact copy of an earlier portion of the input string suffixed by one new symbol from the input data. The copy which is to be made is the longest possible and is not constrained to coincide with any earlier parsed segment. The code word which replaces the segment in the output contains information consisting of a pointer to where there earlier copied portion begins, the length of the copy, and the new symbol.

To help keep cost reasonably, data compression is used in the art of page printers such as electrophotography. For example, a 600 dot per inch (DPI) page is about 4 MB in size. By using a compression technique, this can be reduced to about 1 MB. The art of electrophotography printing places a performance constraint for the decompression process. In particular, the compressed data must be decompressed fast enough to provide a constant stream of data to the print engine. To insure that this performance requirement is met, the decompression task is performed by hardware.

Hardware data decompression is typically simplified by first, using a fixed code size and second, reserving special codes that aid the decompressor. By using a fixed code size, the decompressor will accept a fixed code size and produce a fixed code. Thus, for example, a typical hardware decompressor will accept a compressed 8-bit byte and output one or more 8-bit decompressed bytes. Because the input is fixed, special codes are necessary to direct the decompressor. One such arrangement reserves a LITERAL prefix to indicate that the next code is a literal that is, it is not compressed. Additional, an END_OFDATA code is defined such that the hardware decompressor stops when it detects the EOD code. The EOD code is optional if the size of the uncompressed data is known and the decompressor is informed of this length.

SUMMARY OF THE INVENTION

In order to accomplish the present invention, there is provided a method for reducing the amount of memory used to store an original data in a processing system. The method is completed by first receiving an entry of the original data. This entry is compared to valid elements in a dictionary where the dictionary is stored in the memory. If a match between the entry and a valid dictionary element is found, then a data code is stored as compressed data in the memory, where the data code points to the valid dictionary element. If on the other hand, a match is not found, then the entry is defined as a literal.

Assuming the literal is defined, next determine if a dictionary element pointed to by the literal is valid and if so, then store a literal prefix into the compressed data in the memory. Finally, independent of whether the lateral points to a valid dictionary element, the literal itself is stored into the compressed data in the memory. Compression of the original data requires repeating the above steps until all entries in the original data are processed.

To decompress the compressed data first an entry of the compressed data is retrieved from the memory. If the entry is a literal prefix, then output a next entry of the compressed data. In the alternative, if the entry points to an invalid dictionary element then output the entry because it is a literal. Finally, the only alternative remaining is that the entry points to a valid dictionary element. Thus the a code that must be decompressed before it can be output.

BRIEF DESCRIPTION OF THE DRAWINGS

A better understanding of the invention may be had from the consideration of the following detailed description of the preferred embodiment taken in conjunction with the accompanying drawings in which:

FIG. 1 shows a segment of compressed data where a LITERAL PREFIX must precede every literal.

FIG. 2 shows the dictionary content for the compressed data segments of FIGS. 1 and 7.

FIG. 3 shows the rules used by the decompressor to up date the dictionary.

FIG. 4 shows the dictionary content for the compressed data segments of FIGS. 1 and 7.

FIG. 5 shows the dictionary content for the compressed data segments of FIGS. 1 and 7.

FIG. 6 shows the dictionary content for the compressed data segments of FIGS. 1 and 7.

FIG. 7 shows the same segment of compressed data as in FIG. 1 using the present invention.

FIG. 8 displays the original, uncompressed data used for exemplary purposes.

FIG. 9A-9G displays the compressed data and dictionary for each step of the compression process using the exemplary data of FIG. 8.

FIG. 10 displays the compressed data created by compressing the original data of FIG. 8.

FIG. 11A-11I displays the uncompressed data and dictionary for each step of the decompression process using the exemplary data of FIG. 10.

DETAILED DESCRIPTION OF THE PREFERRED EMBODIMENTS

Figure 12:
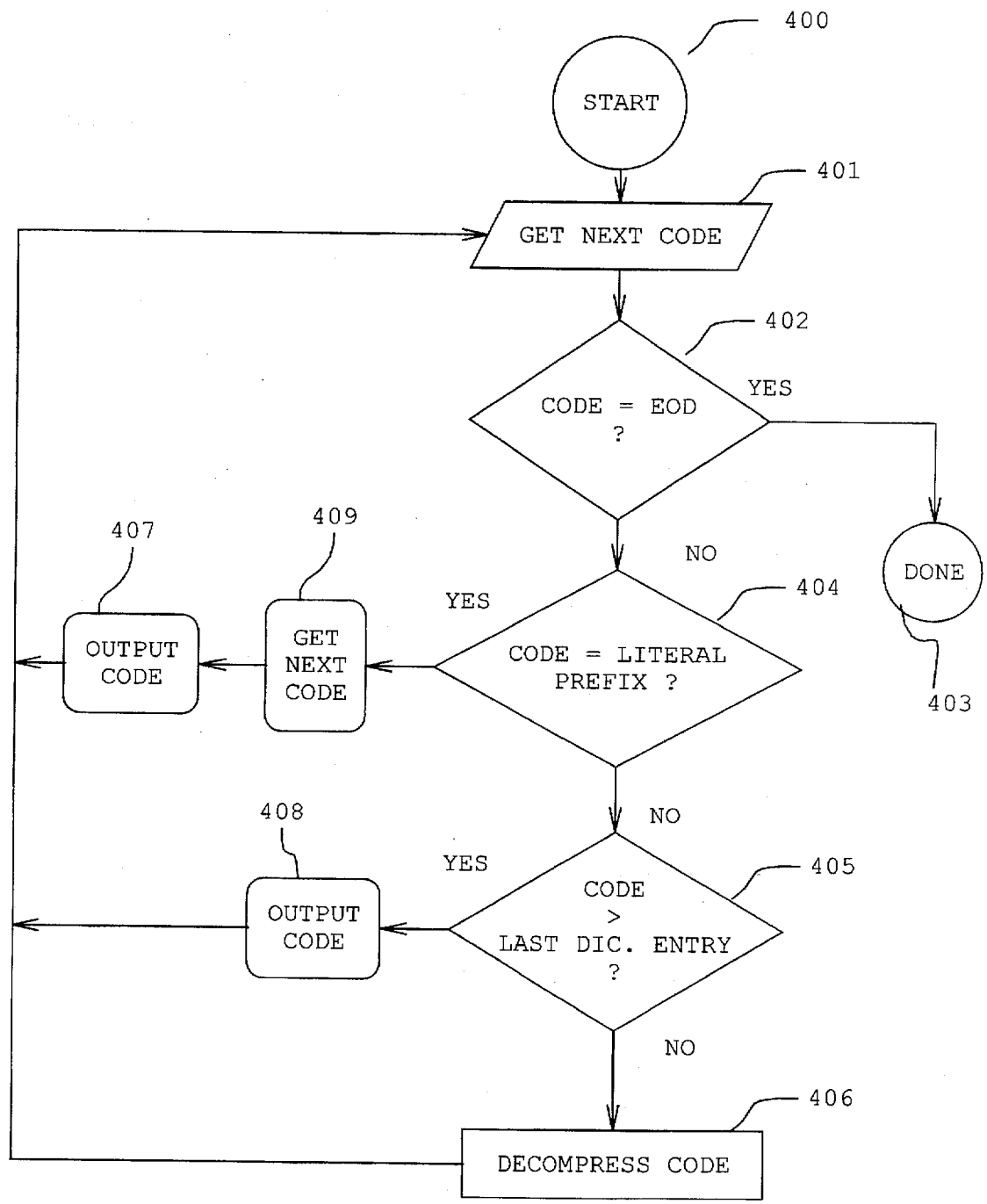
FIG. 12 is a flowchart showing an embodiment for data decompression in accordance with the present invention.

Before the preferred embodiment can be described, a basic understanding of the compression scheme used will be given. The preferred embodiment uses the LZS8 derivative of the LZ compression scheme because it uses fixed code sizes. LZS8 compresses data into two basic types, literals and codes. A code is an address into a dictionary that contains a string, whereas a literal is data that is transferred directly to the output when decompressing. A reserved code (LITERAL PREFIX) precedes the literal to indicate that the literal is not a code. A reduction in efficiency is primarily the result of requiring the use of the reserved LITERAL PREFIX. As stated above, the LITERAL PREFIX indicates to the decompressor that the next code is a literal, that is, it is not compressed. Thus, anytime during the compression process data is stored uncompressed it must be prefaced with the LITERAL PREFIX. Therefore, two bytes are needed to store one byte of uncompressed information.

LZS8 builds the dictionary as the data is compressed or decompressed. At the beginning, the dictionary is empty. Codes are added to the dictionary as the data is processed. During the decompression, a code points to a dictionary entry that represents the originally compressed string. Thus, for compressible data, the dictionary will contain long strings that can be represented by a single code.

In the described implementation of LZS8, the dictionary grows from 00 to FF (255). While other implementations of the LZS8 compression scheme are possible, the preferred embodiment of the present invention is described with the understanding that the dictionary grows sequentially and in the positive direction. A pointer is maintained in both the compressor and decompressor indicating the boundary between valid and invalid codes in the dictionary. This same pointer is used to update the dictionary with valid strings during both the compression and decompression. The preferred embodiment relies on the understanding that the pointer moves from 00 to FF during the compression and decompression process. However, as will be described later, other embodiments are possible.

By way of an example, FIG. 1 shows a segment of compressed data using the LITERAL PREFIX as known in the art. FIG. 1 also shows the optional END_OF_DATA code. Additionally, FIG. 2 shows the "dictionary" contents for the start of segment of data in FIG. 1. Finally, FIG. 3 provide the rules used by the decompressor to update the dictionary.

Before the example is described and understood, the structure of the dictionary must first be understood. Referring to FIG. 2, in the preferred embodiment entries are stored in the dictionary as a link and data. A link points to another dictionary entry or indicates that the present entry is the root. Thus, links are used to form a linked list in the dictionary such that by traversing the link list, the string represented by that entry can be reproduced. With this understanding, the string described by a given entry is written using the shorthand notation of STRING IN LOC XX.

The following is a detailed description of what occurs when the data segment of FIG. 1 enters the decompressor. The first block, 0x12, is identified as an index into the dictionary. Using this index, the decompressor outputs STRING IN LOCATION 02. For simplification, assume that the first block was preceded by a literal, thus not requiring an update to the dictionary. Next, the decompressor receives 0x00, which is defined as the LITERAL PREFIX. The decompressor outputs 0x34, the next byte. Before the decompression process continues, the dictionary must be updated using the rules of FIG. 3. Given compressed data followed by a literal, FIG. 3 indicates that two updates must be performed to the dictionary. First a new string is added then a new root. The new string consists of the literal 34 plus the STRING IN LOC 12. This is stored is saved in location 00x15 as 12/34 (link/data). The new root is stored in location 00x16 as 00/34. Note, in this embodiment, a link of 00 indicates that this entry is the root of any links. The new dictionary is shown in FIG. 4.

After updating the dictionary, the decompressor retrieves the next code, which is 00x14. Because this is a valid dictionary entry, the decompressor outputs the STRING IN LOCATION 14. FIG. 3, shows that when a literal is followed by compressed data no updates to the dictionary are necessary.

Next, the decompressor receives the compressed data code 00x12 and therefore outputs STRING IN LOCATION 12. When compressed data is followed by compressed data, FIG. 3 shows that the dictionary must be updated one time. This time the decompressor adds a new string which consists of the STRING IN LOCATION 14 plus the data from the STRING IN LOCATION 12. For exemplary purposes, the data from the STRING IN LOCATION 12 is shown as 75. Thus the new dictionary entry is 14/75 and stored in location 00x17 as shown in FIG. 5.

The next entry in FIG. 1 is a LITERAL PREFIX. This immediately indicates to the decompressor that the next entry is a literal. Thus the decompressor retrieves the next entry 0x12 and directly outputs it to the data. stream. Next, the dictionary must be updated two times as indicated in FIG. 3. First, the new string is entered and then a new root. The new string consists of the literal 12 plus the STRING IN LOC 12. This is stored is saved in location 00x18 as 12/12. The new root is stored in location 00x19 as 00/12. The new dictionary is shown in FIG. 6.

Finally, The decompressor retrieves the EOD code and decompression stops. As stated before, the EOD code is optional, but does provide a simple means of indicating the end. However, this simplicity does reduce the number of possible dictionary entries by one leading to slightly lower compression ratios.

From the above example, two observations can be made. First, the dictionary originally starts empty, or stated differently, entries in the dictionary are undefined for a significant percentage of time. Second, the use of the LITERAL PREFIX adversely impacts compression efficiency. Using these observations, the present invention eliminates the need to always precede a literal with the LITERAL PREFIX. In particular, if a literal points to an undefined dictionary element, then the literal does not need a LITERAL PREFIX preceding it.

The data segment in FIG. 7 shows the data segment of FIG. 1 using the present invention. Close examination of FIG. 7 shows that the first LITERAL PREFIX has been removed. As before, the first block, 0x12 is an index into the dictionary. Using this index, the decompressor outputs STRING IN LOCATION 12. Next, the decompressor receives 0x34. The decompressor knows that the last valid dictionary entry is 0x14, thus 0x34 must be a literal. Therefore, the decompressor outputs 0x34. In a similar manor, the decompressor outputs STRING IN LOCATION 14 and STRING IN LOCATION 12. Next, the decompressor receives 0x00, which is LITERAL PREFIX. This LITERAL PREFIX could not be deleted because the literal 0x12 is a valid dictionary entry. Had the decompressor received the literal 0x12 without the preceding LITERAL PREFIX, it would of assumed that it was a code and output STRING IN LOCATION 12 instead of the correct 0x12 literal.

With that cursory look at the decompression processes, an actual example showing both the compression and decompresses may help the reader in better understanding the present invention.

FIG. 8 shows a compressible string used to illustrate both the compression and decompression process in detail. As would normally occur, the compression process will first be described. Referring to FIG. 9A, starting with an empty dictionary the compressor retrieves K first. Because there is no previous entries in the dictionary there can be no matches to this first character. As such, it is defined as literal and input into the dictionary as a root at location 2. For reasons which will be evident later, the first entry in the dictionary requires the LITERAL PREFIX 00 to prefix it in the output stream. Therefore, the output stream contains as a first byte 00 followed by the literal K.

Next, in FIG. 9B the compressor retrieves the second entry in the input data stream, that being w. A search is made of the dictionary wherein the compressor determines that there is no match. Therefore it is now defined as literal. The dictionary is updated at location 3 to contain a literal w and a link of 00 indicating that the character is the root of a string. Additionally, the literal w must be placed in the output stream. In accordance with the present invention, this character does need the LITERAL PREFIX.

In FIG. 9C the compressor has retrieved the next character in the input stream. Again the dictionary is searched and no match is found. The newly defined literal must be added to the dictionary at location 4 and inserted in the output stream. Also shown in FIG. 9C is a imaginary pointer just to the left of location 4. It is this pointer that is used to indicate the last valid location inside the dictionary.

Next, the compressor retrieves the letter capital K from the input data stream as shown in FIG. 9D. This time, however, a match is found at location 2. The letter lower case w is retrieved from the input stream forming the string Kw. After searching the dictionary, the compressor determines that the string Kw does not exist within the dictionary and therefore, must be added to the dictionary. The dictionary in FIG. 9D shows location 5 containing link 02 and data w. Traversing the linked list as defined in location 5 refers back to location 2 where the link is 00. Thus the string in location 5 becomes Kw. Prior to this entry no real data compression has occurred. However, here two letters, namely Kw, are represented by one entry in the output stream.

The next character is retrieved from the input string and analyzed by the compressor. See FIG. 9E. Presently the compressor is looking at the string w underscore. The character w is found in the dictionary at location 3 indicating to the compressor to output index 03 to the output stream. The next character, underscore, is also found in the dictionary. As shown in FIG. 9E the compressor now inserts the index 04 into the output stream. However, the string w underscore was not found in the dictionary, therefore, the compressor enters it in location 06.

The compressor, next, retrieves the character K from the input stream as shown in FIG. 9F. Searching the dictionary, the compressor finds a match at location 2. Once the match is found, the compressor retrieves next input character, which is in this case is w. Again searching the dictionary the string Kw is found at location 05. Adding the next character from the input string, K, results in no matches in the present dictionary. Once a string that is not in the dictionary is found, the compressor will output the location of the last found string, which in this case is 05. Here, two additions must be made to the dictionary. First, the previous string of underscore K is added at location 07. Second, the new string K w K is added to the dictionary at location 08.

Continuing on with the compression process, the compressor retrieves the next character from the input string. Referring to FIG. 9G, working with the string Kw, the compressor finds a match at location 5. Adding the next character from the input string, K, the compressor finds a match at location 08. Continuing until a match is not found, the compressor next retrieves A from the input stream. Searching the dictionary the compressor does not find a match for the string KwKA. Therefore the compressor outputs the last valid match location number 08 into the output stream. Additionally the new string of KwKA is added to the dictionary at location 9 and the literal A is added at location 0A. Finally, the literal A is placed in the output stream. Again, according to the present invention the literal A does not need to be prefixed by the LITERAL PREFIX. Finally, the compressor adds the E 0 D code (01) to the end of the output stream.

The original data of FIG. 8 required 12 memory locations to store. After undergoing the compression process the storage requirements for the same string has been reduced by one as shown in FIG. 10.

FIG. 11 shows dictionary contents and output string for decompression of the compressed string of FIG. 10. Starting with FIG. 11A, the decompressor retrieves 00 and K from the input string. Because 00 is defined as the LITERAL PREFIX in the preferred embodiment, it indicates to the decompressor that the next character in the input string is a literal. In this case the decompressor retrieves the next character, which is a K. Using the rules of FIG. 3, the dictionary must be updated. Here the new literal K is inserted into the dictionary at location 2 as shown in FIG. 11A.

Next, in FIG. 11B, the decompressor retrieves the character w from the input string. Using the present invention, the decompressor determines that the letter w points to an invalid location in the dictionary. As such, the decompressor understands that the character w is a literal and outputs it to the output string. FIG. 11B shows that the dictionary is also updated to include the new literal w at location 03.

Decompressor retrieves the next character, an underscore as shown in FIG. 11C. As with the previous character, the present character points to an invalid dictionary element. Once again the decompressor knows that the underscore character is a literal and should be transferred directly to the output stream. Additionally the dictionary must also be updated to include this literal at location 04.

In FIG. 11D the decompressor retrieves the next input character, which is a 02. Here, the character points to a valid dictionary entry. Therefore, the decompressor extracts the string stored in location 2. Because the link of 00 in location 2 indicates that the data, K, is the root of the string, the decompressor knows the entire string has stored in location 02. Therefore, a K is transferred to the output string. The dictionary of FIG. 11D shows that in accordance with the rules as stated in FIG. 3, no update is necessary.

FIG. 11E shows decompressor retrieving the next code, 03, from the input data stream. Using 03 has an index into the dictionary the decompressor retrieves the data w and outputs it to the output string. According to the rules of FIG. 3 the decompressor must update the dictionary one time because it has received two compressed bytes in a row. As shown in FIG. 11E the dictionary is updated to create the string Kw in location 5. This is accomplished by inserting w in the data portion of location 5 and adding the link 02 to the link portion.

Continuing with the decompression, code 04 from FIG. 11F is also interpreted as a compressed data byte because it points to a valid dictionary entry. Thus, string at location 04 in FIG. 11F is the single byte or single character underscore, which is inserted into the output string. Again, a new string at location 06 is created and stored in the dictionary.

Code 05 in the input sequence is also a valid dictionary entry. Looking at the dictionary in FIG. 11G, the string in location 5 is Kw. As such, the decompressor outputs this string to the output stream. Again, a new dictionary entry is created. Given compressed data followed by compressed data, FIG. 3 shows that the dictionary must be updated one time. Referring to location 07 in FIG. 11G, the new entry is defined as 04/K. 04 originates from the previous compressed data code from FIG. 11F. The K comes from the first character in a string as stored in 05.

FIG. 11H exemplifies a special problem where a code is the compressed data which does not exist in the decompressor's dictionary yet. Here, the decompressor has retrieved code 08 from the input string. However, entry 08 has not yet been added to the dictionary. Thus, the decompressor might assume that 08 is a literal in accordance with the present invention. That assumption would be incorrect in this particular circumstance. This problem arises because the decompressor's dictionary is equal to the compressor's dictionary by plus or minus one at any given time. In this special case where the decompressor is accessing the very next element in the dictionary which has not yet been defined, the dictionary must first be updated before the output string can be defined. Using the rules of FIG. 3 and realizing that in the present situation there has been compressed data 05 from FIG. 11G followed by compressed data 08 in FIG. 11H, the dictionary must be updated one time. The new dictionary entry 08 consists of a link back to the previous compressed string, 05, and data from the beginning of string in location 05. The complete entry in the dictionary at location 08 is shown in FIG. 11H. With entry 08 now defined, the decompressor can extract the string and location 08 and insert into the output string. String 08 is K from location 2, w from location 5, and K from location 8.

Finally in FIG. 11I the decompressor retrieves the input character A and compares it to the dictionary. Finding that A points to an invalid location, the decompressor understands that A is a literal and inserts it into the output stream. The literal A is followed by the E O D code of 01 indicating to the decompressor that its function is complete.

As stated earlier when described in FIG. 9A it was noted that the original input character K would actually point to an invalid dictionary location. However, the LITERAL PREFIX 00 is inserted prior to the K. It was also stated earlier that the compressor's dictionary and decompressor' dictionary are synchronized to each other by plus or minus one at any given time. A problem may arise where the compressor's dictionary wraps around i.e. is full and starts over, and the decompressor's dictionary is lagging behind by one. Given those circumstances if the original entry into the dictionary was not preceded by the LITERAL PREFIX 00 during the compression process, the decompressor having a full dictionary compared to the compressor's empty dictionary would believe that the input code was actually pointed to a valid dictionary location and extract the string therein, in error. By requiring the compressor preced the initial entry into the dictionary with the LITERAL PREFIX 00, the decompressor automatically knows that the following byte is a literal. During the processing of that literal, the decompressor's dictionary will again then be synchronized with the dictionary of the compressor.

One skilled in the art will understand that while the dictionary is relatively empty, the compressed data contains many literals and few strings, with each literal preceded with a LITERAL PREFIX. As the dictionary fills, the number of LITERAL PREFIX's that can be eliminated is reduced, however, the compressed data contains fewer literals because the literal data is in strings in the dictionary. Thus, the present invention provides a benefit by reducing the number of LITERAL PREFIXs when their probability of occurrence is high.

Tests indicate that the preferred embodiment reduces the compressed file by approximately 10%. Empirical information relating to compression ratios was obtained using two types of data. The first type consisted of an easy to compress image, such as a bit map character. A more difficult to compress gray scale file was also used. Compression ratios without and with the improvement described herein for the easily compressed file were 9.5:1 to 10.2:1 respectively. The more difficult file produced compression rations of 1.85:1 and 2.02:1.

Implementing the preferred embodiment requires little logic if the compressor is in hardware and little code if the compressor is in software. In either implementations, a pointer to the last valid dictionary entry already exists. Therefore, a compare of the literal to the pointer will quickly determine if the literal needs a LITERAL PREFIX preceding it. A similar pointer also presently exists in the decompressor, so the same compare determines if the input byte is a code or a literal.

The present invention relies on being able to detect if a given dictionary entry is valid or invalid. In the preferred embodiment, this determination is made by comparing the code with a pointer to the last valid entry in the dictionary. However, this is not the only possible embodiment. To use the present invention, the embodiment must indicate whether the requested dictionary entry is valid or invalid. Some possible mechanisms for indicating the validity of dictionary entries include linking them to an invalid location or to them self. If, for example, all invalid dictionary entries are linked to themselves, when the decompressor retrieves a code it looks at whether the link in the dictionary entry points to itself. Form this comparison, the decompressor determines whether the dictionary entry is valid or invalid. Using the present invention, if the dictionary entry is invalid, then the code is a literal.

The flowchart of FIG. 12 shows one possible embodiment for the decompressor. In detail, the decompressor first retrieves a code 401. Next, the decompressor determines what kind of code it has retrieved. In FIG. 12, the code is first compared to the END_OF_DATA code 402. If it matched EOD, then the decompressor is finished 403. Assuming that the code is not EOD, then the decompressor next checks whether the code is the LITERAL PREFIX 404. If it is, then the decompressor knows that the next byte is a literal. Therefore it retrieves the next byte 409 and outputs 407 it to the data stream. If the code is not the LITERAL PREFIX, then the decompressor compares it to the pointer to the last entry to the dictionary 405. A code is a literal and is output directly to the data stream 408 if the code is greater than the pointer. Finally, if the code is a valid pointer to a dictionary entry, that code is decompressed 406.

Figure 13:
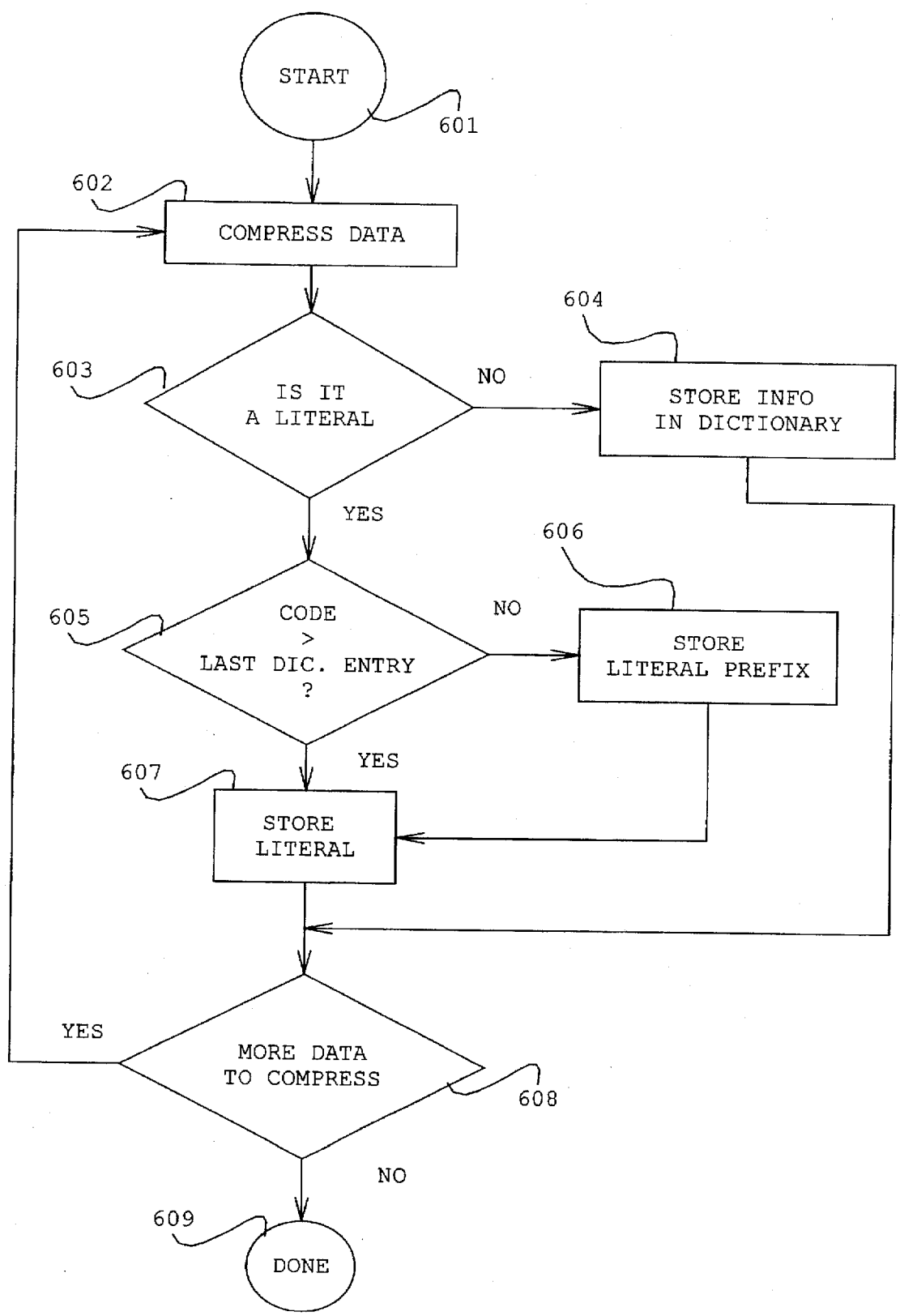
FIG. 13 is a flowchart showing an embodiment for data compression in accordance with the present invention.

FIG. 13 is a flowchart depicting one embodiment of the logical flow for the compressor. In particular, the compressor receives the data and compresses it to generate a code 602. Next, the compressor determines if the code is a literal 603 and if not, it updates the dictionary 604. If the code is a literal, the compressor determines if the code is greater than the pointer to the last valid dictionary entry. 605. A LITERAL PREFIX is inserted 606 if the code is less than the pointer. The space necessary to store the LITERAL PREFIX can be saved if the code is greater than the pointer 607. Finally, the compressor loops around until all the data is compressed 608.

One skilled the art of computer logic will understand that the flowcharts of FIG. 12 and 13 are only meant to illustrate a logical flow that embodies the present invention. Several variations are possible once the underlying idea of the present invention is understood.

Figure 14:
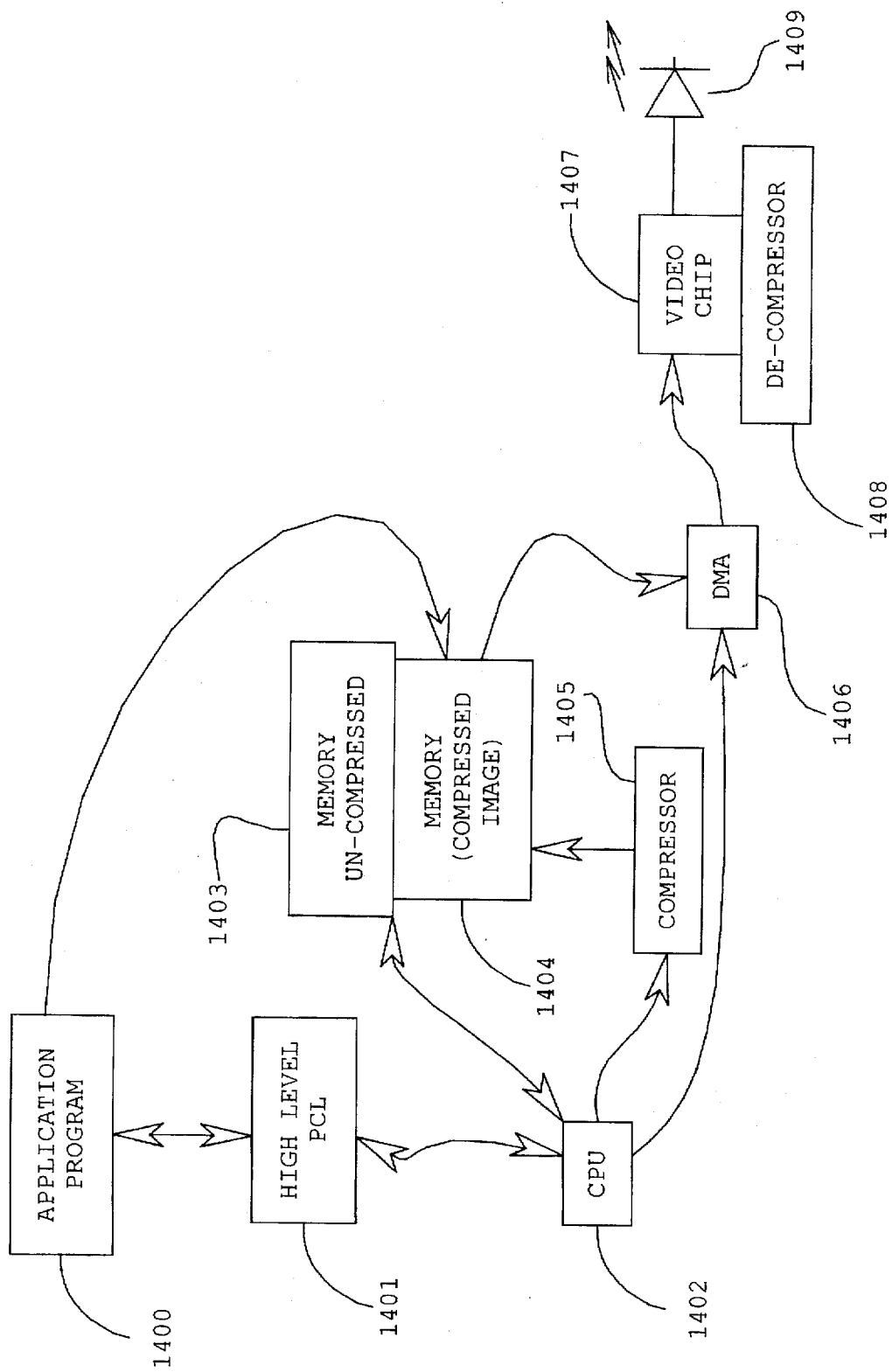
FIG. 14 is a high level block diagram of a printer system that uses the present invention.

Referring to FIG. 14 where a generic block diagram of a printer is shown. Note that APPLICATION PROGRAM 1400 shown in FIG. 14 is not part of the printer system.

While the data compression method can be used several ways with the block diagram of FIG. 14, two primary ways will be discussed here. Selection of a particular method is primarily determined by projected cost of the overall printer system. With a more expensive implementation, CPU 1402 has sufficient processing power and memory to accomplish the compression algorithm itself. With a low cost printer system, CPU 1402 may not be present and memory requirements are kept to a minimum. With the inexpensive arrangement the application program 1400 implements the compression algorithm.

With the high performance printer system, application program 1400 sends data to the printer system using a high level printer control language 1401. CPU 1402 retrieves the data from the high level printer control language 1401 and rasterizes that data in an uncompressed format into memory 1403. Next, the CPU retrieves the uncompressed rasterized information from 1403, passes it through compressor 1405, which then stores the compressed image back into memory 1404. At the appropriate time DMA 1406 under control of CPU 1402 retrieves the compressed image from memory 1404. The compressed image is then transferred to decompressor 1408, which performs the decompression algorithm. The output of decompressor 1408 is fed to video chip 1407 which modulates laser 1409 in accordance with the uncompressed image information.

Under the first arrangement, additional throughput between application program 1400 and the printer system can be accomplished by allowing the application program 1400 to compress the rasterized data prior to sending it to the printer system. Using the data compression method the application program can compress the information and then place it in the proper page description language prior to transmitting it to the high level PCL block 1401. When CPU 1402 retrieves the page description language instruction it will decode the instruction to mean that the following information is compressed data. Thus, CPU 1402 bypasses this step of compression and directly places the compressed data into compressed image memory 1404. As before DMA 1406 again retrieves the compressed image from 1404 transmitting it to decompressor 1408 which decompresses it and passes it onto video chip 1407 and laser diode 1409.

The second arrangement is an effort to minimize the cost of the printer system itself. Such an arrangement uses only blocks memory 1404, DMA 1406, decompressor 1408, video chip 1407 and laser diode 1409. Because the printer system does not contain a CPU, application program 1400 must implement the compression half of the algorithm.

In the normal printing process, DMA 1406 retrieves the compressed image from memory 1404 and, as before, feeds it to decompressor 1408 which decompresses the compressed image. This arrangement may significantly reduce the cost of the printer system since CPU 1402 is no longer necessary. However, such an arrangement does place an additional burden on application program 1400 to rasterize and compress the image.

Although the preferred embodiment of the invention has been illustrated, and that form described, it is readily apparent to those skilled in the art that various modifications may be made therein without departing from the spirit of the invention or from the scope of the appended claims.

What is claimed is:

1. A method for decompressing a compressed data into an original data where said compressed data is stored in memory, said method comprising the steps of:

retrieving an entry of said compressed data from said memory;

if said entry is a literal prefix, then outputting a next entry of said compressed data to said original data, in the alternative said entry is a code;

if said entry points to an invalid dictionary element then outputting said entry to said original data; and if said entry points to a valid dictionary element, then said entry is a code, decompressing said code to said original data.

2. The method of claim 1 further comprises:

updating said dictionary in accordance with said entry and a previous entry.

3. The method of claim 1 wherein said step of decompressing further comprises:

extracting said valid dictionary element; and outputting said valid dictionary element to said original data.

4. The method of claim 2 wherein said step of updating further comprises:

if said entry is said code and said previous entry was a code then first creating a new valid dictionary element, then updating said dictionary with said new valid dictionary element;

if said entry is said literal prefix or is pointing to said invalid dictionary element and said previous entry was a code then second creating a first new valid dictionary element and a second new valid dictionary element, then updating said dictionary with said first new valid dictionary element and said second new valid dictionary element; and if said entry is said literal prefix or is pointing to said invalid dictionary element and said previous entry was said literal prefix or was pointing to an invalid dictionary element then third creating a third new valid dictionary element and a fourth new valid dictionary element, then updating said dictionary with said third new valid dictionary element.

5. The method of claim 1 wherein said dictionary element is invalid if said code points to a dictionary element that is past a last valid dictionary element.

6. A method for compressing an original data into a compressed data where said original data is stored in memory, said method comprising the steps of:

retrieving an entry of said original data from said memory;

comparing said entry to valid elements in a dictionary;

if said step of comparing finds a match between said entry and a valid dictionary element then first outputting into said compressed data a code that points to where in said dictionary said match is;

if said step of comparing fails to find said match then defining said entry as a literal;

if said literal is defined, determining if a dictionary element pointed to by said literal is valid and if so, then outputting a literal prefix into said compressed data; and if said literal is defined, second outputting said literal into said compressed data.

7. The method of claim 6 further comprising:

if said step of comparing finds a match between said entry and a valid dictionary element then iteratively performing said steps of retrieving and comparing until said step of comparing fails to find said match.

8. A method for reducing the amount of memory used to store an original data in a processing system, said method comprising the steps of:

receiving an entry of said original data;

comparing said entry to valid elements in a dictionary where said dictionary is stored in said memory;

if said step of comparing finds a match between said entry and a valid dictionary element then first storing a data code as compressed data in said memory, said data code points to said valid dictionary element;

if said step of comparing fails to find said match then defining said entry as a literal;

if said literal is defined, determining if a dictionary element pointed to by said literal is valid and if so, then second storing a literal prefix into said compressed data in said memory;

if said literal is defined, third storing said literal into said compressed data in said memory;

repeating said steps of receiving, comparing, first storing, defining, second storing, and third storing until all entries in said original data are processed;

retrieving a second entry of said compressed data from said memory;

if said second entry is said literal prefix, then first outputting a next entry of said compressed data;

if said entry points to an invalid dictionary element then second outputting said entry; and if said entry points to a valid dictionary element, then said entry is a code, decompressing said code.

9. The method of claim 8 further comprises updating said dictionary in accordance with said second entry and a previous entry.

10. The method of claim 8 wherein said step of decompressing further comprises:

extracting said valid dictionary element; and outputting said valid dictionary element.

11. The method of claim 8 wherein said dictionary element is invalid if said code points to a dictionary element that is past a last valid dictionary element.

12. The method of claim 8 wherein said step of comparing further comprising:

if said match is found, then adding a subsequent entry of said original data said entry thereby forming a string;

searching said dictionary for said string repeating said steps of adding and searching until said step of searching fails to find said string in said dictionary;

creating a new valid dictionary entry that contains said string, said data code points to said new dictionary entry.

13. The method of claim 12 further comprises if said literal is defined, then second creating a second new valid entry in said dictionary, said second new valid entry contains said literal.

* * * * *